US006876131B2

(12) United States Patent
Wong

(10) Patent No.: US 6,876,131 B2
(45) Date of Patent: Apr. 5, 2005

(54) HIGH-FREQUENCY, LIQUID METAL, LATCHING RELAY WITH FACE CONTACT

(75) Inventor: Marvin Glenn Wong, Woodland Park, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 172 days.

(21) Appl. No.: 10/412,991

(22) Filed: Apr. 14, 2003

(65) Prior Publication Data

US 2004/0201313 A1 Oct. 14, 2004

(51) Int. Cl.[7] ........................ H01L 41/08; H01H 29/24; H01H 55/00; H01H 57/00

(52) U.S. Cl. ......................... 310/328; 310/348; 310/26; 200/182; 200/219; 335/47; 335/49; 335/58

(58) Field of Search .......................... 310/26, 328, 348; 200/182, 214, 215, 219; 335/47, 49, 51, 58

(56) References Cited

U.S. PATENT DOCUMENTS

| | | | | |
|---|---|---|---|---|
| 2,312,672 A | | 3/1943 | Pollard, Jr. | 335/58 |
| 2,564,081 A | | 8/1951 | Schilling | 335/56 |
| 3,289,126 A | * | 11/1966 | Hurvitz | 335/47 |

(Continued)

FOREIGN PATENT DOCUMENTS

| | | |
|---|---|---|
| EP | 0593836 A1 | 10/1992 |
| FR | 2418539 A | 9/1979 |
| FR | 2458138 A1 | 10/1980 |
| FR | 2667396 | 9/1990 |
| JP | SHO 36-18575 | 10/1961 |
| JP | SHO 47-21645 | 10/1972 |
| JP | 63-276838 | 5/1987 |
| JP | 01-294317 | 5/1988 |
| JP | 08-125487 A | 5/1996 |
| JP | 9161640 | 6/1997 |
| WO | WO 99/46624 A1 | 9/1999 |

OTHER PUBLICATIONS

Jonathan Simon, "A Liquid–Filled Microrelay With A Moving Mercury Microdrop" (Sept. 1997), Journal of Microelectromechinical Systems, vol. 6, No. 3. pp. 208–216.

Marvin Glenn Wong, "A Piezoelectrically Actuated Liquid Metal Switch", May 2, 2002, patent application (pending, 12 pages of specification, 5 pages of claims, 1 page of abstract, and 10 sheets of drawings (Figs. 1–10).

Bhedwar, Homi C. et al. "Ceramic Multilayer Package Fabrication." Electronic Materials Handbook, Nov. 1989, pp. 460–469, vol. 1 Packaging, Section 4: Packages.

"Integral Power Resistors for Aluminum Substrate." IBM Technical Disclosure Bulletin, US, Jun. 1, 1984, p. 827, vol. 27, No. 1B, TDB–ACC–NO: NB8406827, Cross Reference: 0018–8689–27–1B–827.

Kim, Joonwon et al. "A Micromechanical Switch with Electrostatically Driven Liquid–Metal Droplet." Sensors and Actuators, A: Physical. v 9798, Apr. 1, 2002, 4 pages.

*Primary Examiner*—Thomas M. Dougherty

(57) ABSTRACT

An electrical relay using conducting liquid in the switching mechanism. The relay is amenable to manufacture by micromachining techniques. In the relay, two electrical contacts are held a small distance apart. The facing surfaces of the contacts each support a droplet of a conducting liquid, such as a liquid metal. An actuator is energized to reduce the gap between the electrical contacts, causing the two liquid metal droplets to coalesce and form an electrical circuit. The actuator is then de-energized and the electrical contacts return to their starting positions. The liquid metal droplets remain coalesced because of surface tension. The electrical circuit is broken by energizing an actuator to increase the gap between the electrical contacts and break the surface tension bond between the liquid metal droplets. The droplets remain separated when the piezoelectric actuator is de-energized because there is insufficient liquid metal to bridge the gap between the contacts. Additional conductors are included in the assembly to provide a coaxial structure and allow for high frequency switching.

22 Claims, 5 Drawing Sheets

U.S. PATENT DOCUMENTS

| | | | | | |
|---|---|---|---|---|---|
| 3,430,020 | A | | 2/1969 | Von Tomkewitsch et al. | 200/181 |
| 3,529,268 | A | | 9/1970 | Rauterberg | 335/56 |
| 3,600,537 | A | | 8/1971 | Twyford | 200/407 |
| 3,639,165 | A | | 2/1972 | Rairden, III | 428/433 |
| 3,657,647 | A | | 4/1972 | Beusman et al. | 324/94 |
| 3,699,485 | A | * | 10/1972 | Lindenmeyer | 335/49 |
| 3,900,820 | A | * | 8/1975 | Ault | 335/52 |
| 4,047,135 | A | * | 9/1977 | Stuckert | 335/58 |
| 4,103,135 | A | | 7/1978 | Gomez et al. | 200/185 |
| 4,199,739 | A | * | 4/1980 | Deith | 335/58 |
| 4,200,779 | A | | 4/1980 | Zakurdaev et al. | 200/187 |
| 4,238,748 | A | * | 12/1980 | Goullin et al. | 335/56 |
| 4,245,886 | A | | 1/1981 | Kolodzey et al. | 385/19 |
| 4,260,970 | A | * | 4/1981 | Bitko | 335/52 |
| 4,336,570 | A | | 6/1982 | Brower | 362/4 |
| 4,400,671 | A | * | 8/1983 | Legrand | 335/56 |
| 4,419,650 | A | | 12/1983 | John | 337/119 |
| 4,434,337 | A | | 2/1984 | Becker | 200/220 |
| 4,475,033 | A | | 10/1984 | Willemsen et al. | 250/201.1 |
| 4,505,539 | A | | 3/1985 | Auracher et al. | 385/19 |
| 4,582,391 | A | | 4/1986 | Legrand | 385/17 |
| 4,628,161 | A | | 12/1986 | Thackrey | 200/61.47 |
| 4,652,710 | A | | 3/1987 | Karnowsky et al. | 200/235 |
| 4,657,339 | A | | 4/1987 | Fick | 385/22 |
| 4,742,263 | A | | 5/1988 | Harnden, Jr. et al. | 310/331 |
| 4,786,130 | A | | 11/1988 | Georgiou et al. | 385/48 |
| 4,797,519 | A | | 1/1989 | Elenbaas | 200/226 |
| 4,804,932 | A | | 2/1989 | Akanuma et al. | 335/38 |
| 4,988,157 | A | | 1/1991 | Jackel et al. | 385/17 |
| 5,278,012 | A | | 1/1994 | Yamanaka et al. | 430/30 |
| 5,415,026 | A | | 5/1995 | Ford | 73/651 |
| 5,502,781 | A | | 3/1996 | Li et al. | 385/4 |
| 5,644,676 | A | | 7/1997 | Blomberg et al. | 370/416 |
| 5,675,310 | A | | 10/1997 | Wojnarowski et al. | 338/309 |
| 5,677,823 | A | | 10/1997 | Smith | 361/234 |
| 5,751,074 | A | | 5/1998 | Prior et al. | 307/118 |
| 5,751,552 | A | | 5/1998 | Scanlan et al. | 361/707 |
| 5,828,799 | A | | 10/1998 | Donald | 385/16 |
| 5,841,686 | A | | 11/1998 | Chu et al. | 365/51 |
| 5,849,623 | A | | 12/1998 | Wojnarowski et al. | 438/382 |
| 5,874,770 | A | | 2/1999 | Saia et al. | 257/536 |
| 5,875,531 | A | | 3/1999 | Nellissen et al. | 29/25.35 |
| 5,886,407 | A | | 3/1999 | Polese et al. | 257/706 |
| 5,889,325 | A | | 3/1999 | Uchida et al. | 257/724 |
| 5,912,606 | A | | 6/1999 | Nathanson et al. | 335/47 |
| 5,915,050 | A | | 6/1999 | Russell et al. | 385/7 |
| 5,972,737 | A | | 10/1999 | Polese et al. | 438/122 |
| 5,994,750 | A | | 11/1999 | Yagi | 257/415 |
| 6,021,048 | A | | 2/2000 | Smith | 361/236 |
| 6,180,873 | B1 | | 1/2001 | Bitko | 174/9 F |
| 6,201,682 | B1 | | 3/2001 | Mooij et al. | 361/306.1 |
| 6,207,234 | B1 | | 3/2001 | Jiang | 427/333 |
| 6,212,308 | B1 | | 4/2001 | Donald | 385/16 |
| 6,225,133 | B1 | | 5/2001 | Yamamichi et al. | 438/3 |
| 6,278,541 | B1 | | 8/2001 | Baker | 359/291 |
| 6,304,450 | B1 | | 10/2001 | Dibene, II et al. | 361/204 |
| 6,320,994 | B1 | | 11/2001 | Donald et al. | 385/16 |
| 6,323,447 | B1 | | 11/2001 | Kondoh et al. | |
| 6,351,579 | B1 | | 2/2002 | Early et al. | 385/16 |
| 6,356,679 | B1 | | 3/2002 | Kapany | 385/16 |
| 6,373,356 | B1 | | 4/2002 | Gutierrez et al. | |
| 6,396,012 | B1 | | 5/2002 | Bloomfield | 200/233 |
| 6,396,371 | B2 | | 5/2002 | Streeter et al. | 335/78 |
| 6,408,112 | B1 | | 6/2002 | Bartels | 385/16 |
| 6,446,317 | B1 | | 9/2002 | Figueroa et al. | 29/25.42 |
| 6,453,086 | B1 | | 9/2002 | Tarazona | 385/20 |
| 6,470,106 | B2 | | 10/2002 | McClelland et al. | 385/16 |
| 6,487,333 | B2 | | 11/2002 | Fouquet et al. | 385/18 |
| 6,501,354 | B1 | | 12/2002 | Gutierrez et al. | 335/47 |
| 6,512,322 | B1 | | 1/2003 | Fong et al. | |
| 6,515,404 | B1 | | 2/2003 | Wong | |
| 6,516,504 | B2 | | 2/2003 | Schaper | 29/25.42 |
| 6,559,420 | B1 | | 5/2003 | Zarev | 219/209 |
| 6,633,213 | B1 | | 10/2003 | Dove | 335/78 |
| 6,730,866 | B1 | * | 5/2004 | Wong et al. | 200/182 |
| 6,762,378 | B1 | * | 7/2004 | Wong | 200/182 |
| 2002/0037128 | A1 | | 3/2002 | Burger et al. | 385/16 |
| 2002/0146197 | A1 | | 10/2002 | Yong | 385/17 |
| 2002/0150323 | A1 | | 10/2002 | Nishida et al. | 385/16 |
| 2002/0168133 | A1 | | 11/2002 | Saito | 385/16 |
| 2003/0035611 | A1 | | 2/2003 | Shi | 385/16 |
| 2004/0200702 | A1 | * | 10/2004 | Fong et al. | 200/182 |
| 2004/0201318 | A1 | * | 10/2004 | Wong | 310/328 |
| 2004/0201319 | A1 | * | 10/2004 | Wong et al. | 310/328 |

* cited by examiner

HIGH-FREQUENCY, LIQUID METAL, LATCHING RELAY WITH FACE CONTACT

CROSS REFERENCE TO RELATED APPLICATIONS

This application is related to the following co-pending U.S. patent applications, being identified by the below enumerated identifiers and arranged in alphanumerical order, which have the same ownership as the present application and to that extent are related to the present application and which are hereby incorporated by reference:

Application 10010448-1, titled "Piezoelectrically Actuated Liquid Metal Switch", filed May 2, 2002 and identified by Ser. No. 10/137,691;

Application 10010529-1, "Bending Mode Latching Relay", and having the same filing date as the present application;

Application 10010531-1, "High Frequency Bending Mode Latching Relay", and having the same filing date as the present application;

Application 10010570-1, titled "Piezoelectrically Actuated Liquid Metal Switch", filed May 2, 2002 and identified by Ser. No. 10/142,076;

Application 10010572-1, "Liquid Metal, Latching Relay with Face Contact", and having the same filing date as the present application;

Application 10010573-1, "Insertion Type Liquid Metal Latching Relay", and having the same filing date as the present application;

Application 10010617-1, "High-frequency, Liquid Metal, Latching Relay Array", and having the same filing date as the present application;

Application 10010618-1, "Insertion Type Liquid Metal Latching Relay Array", and having the same filing date as the present application;

Application 10010634-1, "Liquid Metal Optical Relay", and having the same filing date as the present application;

Application 10010640-1, titled "A Longitudinal Piezoelectric Optical Latching Relay", filed Oct. 31, 2001 and identified by Ser. No. 09/999,590;

Application 10010643-1, "Shear Mode Liquid Metal Switch", and having the same filing date as the present application;

Application 10010644-1, "Bending Mode Liquid Metal Switch", and having the same filing date as the present application;

Application 10010656-1, titled "A Longitudinal Mode Optical Latching Relay", and having the same filing date as the present application;

Application 10010663-1, "Method and Structure for a Pusher-Mode Piezoelectrically Actuated Liquid Metal Switch", and having the same filing date as the present application;

Application 10010664-1, "Method and Structure for a Pusher-Mode Piezoelectrically Actuated Liquid Metal Optical Switch", and having the same filing date as the present application;

Application 10010790-1, titled "Switch and Production Thereof", filed Dec. 12, 2002 and identified by Ser. No. 10/317,597;

Application 10011055-1, "High Frequency Latching Relay with Bending Switch Bar", and having the same filing date as the present application;

Application 10011056-1, "Latching Relay with Switch Bar", and having the same filing date as the present application;

Application 10011064-1, "High Frequency Push-mode Latching Relay", and having the same filing date as the present application;

Application 10011065-1, "Push-mode Latching Relay", and having the same filing date as the present application;

Application 10011121-1, "Closed Loop Piezoelectric Pump", and having the same filing date as the present application;

Application 10011329-1, titled "Solid Slug Longitudinal Piezoelectric Latching Relay", filed May 2, 2002 and identified by Ser. No. 10/137,692;

Application 10011344-1, "Method and Structure for a Slug Pusher-Mode Piezoelectrically Actuated Liquid Metal Switch", and having the same filing date as the present application;

Application 10011345-1, "Method and Structure for a Slug Assisted Longitudinal Piezoelectrically Actuated Liquid Metal Optical Switch", and having the same filing date as the present application;

Application 10011397-1, "Method and Structure for a Slug Assisted Pusher-Mode Piezoelectrically Actuated Liquid Metal Optical Switch", and having the same filing date as the present application;

Application 10011398-1, "Polymeric Liquid Metal Switch", and having the same filing date as the present application;

Application 10011410-1, "Polymeric Liquid Metal Optical Switch", and having the same filing date as the present application;

Application 10011436-1, "Longitudinal Electromagnetic Latching Optical Relay", and having the same filing date as the present application;

Application 10011437-1, "Longitudinal Electromagnetic Latching Relay", and having the same filing date as the present application;

Application 10011458-1, "Damped Longitudinal Mode Optical Latching Relay", and having the same filing date as the present application;

Application 10011459-1, "Damped Longitudinal Mode Latching Relay", and having the same filing date as the present application;

Application 10020013-1, titled "Switch and Method for Producing the Same", filed Dec. 12, 2002 and identified by Ser. No. 10/317,963;

Application 10020027-1, titled "Piezoelectric Optical Relay", filed Mar. 28, 2002 and identified by Ser. No. 10/109,309;

Application 10020071-1, titled "Electrically Isolated Liquid Metal Micro-Switches for Integrally Shielded Microcircuits", filed Oct. 8, 2002 and identified by Ser. No. 10/266,872;

Application 10020073-1, titled "Piezoelectric Optical Demultiplexing Switch", filed Apr. 10, 2002 and identified by Ser. No. 10/119,503;

Application 10020162-1, titled "Volume Adjustment Apparatus and Method for Use", filed Dec. 12, 2002 and identified by Ser. No. 10/317,293;

Application 10020241-1, "Method and Apparatus for Maintaining a Liquid Metal Switch in a Ready-to-Switch Condition", and having the same filing date as the present application;

Application 10020242-1, titled “A Longitudinal Mode Solid Slug Optical Latching Relay”, and having the same filing date as the present application;

Application 10020473-1, titled “Reflecting Wedge Optical Wavelength Multiplexer/Demultiplexer”, and having the same filing date as the present application;

Application 10020540-1, “Method and Structure for a Solid Slug Caterpillar Piezoelectric Relay”, and having the same filing date as the present application;

Application 10020541-1, titled “Method and Structure for a Solid Slug Caterpillar Piezoelectric Optical Relay”, and having the same filing date as the present application;

Application 10030438-1, “Inserting-finger Liquid Metal Relay”, and having the same filing date as the present application;

Application 10030440-1, “Wetting Finger Liquid Metal Latching Relay”, and having the same filing date as the present application;

Application 10030521-1, “Pressure Actuated Optical Latching Relay”, and having the same filing date as the present application;

Application 10030522-1, “Pressure Actuated Solid Slug Optical Latching Relay”, and having the same filing date as the present application; and Application 10030546-1, “Method and Structure for a Slug Caterpillar Piezoelectric Reflective Optical Relay”, and having the same filing date as the present application.

FIELD OF THE INVENTION

The invention relates to the field of micro-electromechanical systems (MEMS) for electrical switching, and in particular to a high frequency piezoelectrically actuated latching relay with liquid metal contacts.

BACKGROUND OF THE INVENTION

Liquid metals, such as mercury, have been used in electrical switches to provide an electrical path between two conductors. An example is a mercury thermostat switch, in which a bimetal strip coil reacts to temperature and alters the angle of an elongated cavity containing mercury. The mercury in the cavity forms a single droplet due to high surface tension. Gravity moves the mercury droplet to the end of the cavity containing electrical contacts or to the other end, depending upon the angle of the cavity. In a manual liquid metal switch, a permanent magnet is used to move a mercury droplet in a cavity.

Liquid metal is also used in relays. A liquid metal droplet can be moved by a variety of techniques, including electrostatic forces, variable geometry due to thermal expansion/contraction and magneto-hydrodynamic forces.

Conventional piezoelectric relays either do not latch or use residual charges in the piezoelectric material to latch or else activate a switch that contacts a latching mechanism.

Rapid switching of high currents is used in a large variety of devices, but provides a problem for solid-contact based relays because of arcing when current flow is disrupted. The arcing causes damage to the contacts and degrades their conductivity due to pitting of the electrode surfaces.

Micro-switches have been developed that use liquid metal as the switching element and the expansion of a gas when heated to move the liquid metal and actuate the switching function. Liquid metal has some advantages over other micro-machined technologies, such as the ability to switch relatively high powers (about 100 mW) using metal-to-metal contacts without micro-welding or overheating the switch mechanism. However, the use of heated gas has several disadvantages. It requires a relatively large amount of energy to change the state of the switch, and the heat generated by switching must be dissipated effectively if the switching duty cycle is high. In addition, the actuation rate is relatively slow, the maximum rate being limited to a few hundred Hertz.

SUMMARY

A high frequency electrical relay is disclosed that uses a conducting liquid in the switching mechanism. In the relay, two contacts are held a small distance apart. The facing surfaces of the contacts each support a droplet of a conducting liquid, such as a liquid metal. In an exemplary embodiment, a piezoelectric actuator is preferably energized to reduce the gap between the electrical contacts, causing the two conducting liquid droplets to coalesce and form an electrical circuit. The piezoelectric actuator is then de-energized and the electrical contacts return to their starting position. The liquid metal droplets remain coalesced because of surface tension. The electrical circuit is broken by energizing a piezoelectric actuator to increase the gap between the electrical contacts and break the surface tension bond between the conducting liquid droplets. The droplets remain separated when the piezoelectric actuator is de-energized because there is insufficient conducting liquid to bridge the gap between the contacts. Additional conductors are included in the assembly to provide a coaxial structure and allow for high frequency switching. The relay is amenable to manufacture by micro-machining techniques.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION

Figure 1:
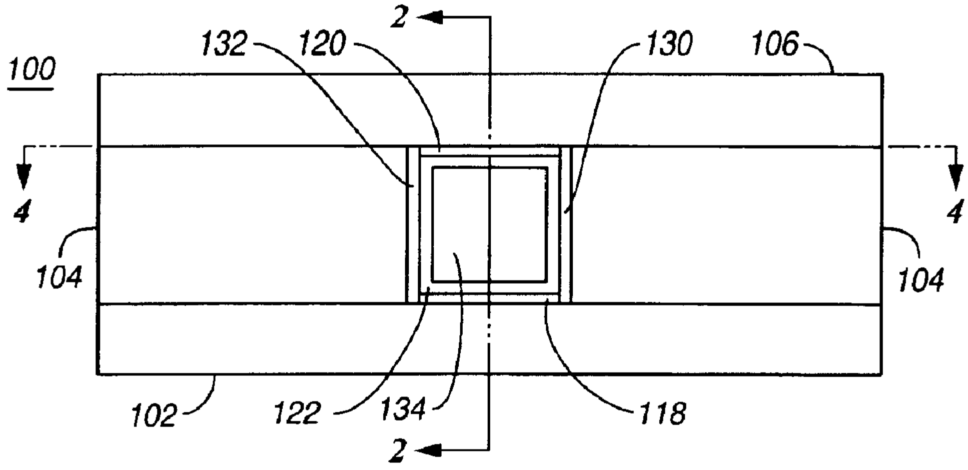
FIG. 1 is an end view of a latching relay in accordance with certain embodiments of the present invention.

While this invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described. In the description below, like reference numerals are used to describe the same, similar or corresponding parts in the several views of the drawings.

The electrical relay of the present invention uses a conducting liquid, such as liquid metal, to bridge the gap between two electrical contacts and thereby complete an electrical circuit between the contacts. The two electrical contacts are held a small distance apart. Each of the facing surfaces of the contacts supports a droplet of a conducting liquid. In an exemplary embodiment, the conducting liquid is preferably a liquid metal, such as mercury, with high conductivity, low volatility and high surface tension. An actuator is coupled to the first electrical contact. In an exemplary embodiment the actuator is preferably a piezoelectric actuator, but other actuators such as magnetorestrictive actuators, may be used. When energized, the actuator moves the first electrical contact towards the second electrical contact, causing the two conducting liquid droplets to coalesce and complete an electrical circuit between the contacts. The piezoelectric actuator is then de-energized and the first electrical contact returns to its starting position. The conducting liquid droplets remain coalesced because of surface tension. In this manner, the relay is latched. The electrical circuit is broken by energizing a piezoelectric actuator to move the first electrical contact away from the second electrical contact to break the surface tension bond between the conducting liquid droplets. The droplets remain separated when the piezoelectric actuator is de-energized because there is insufficient liquid to bridge the gap between the contacts. The relay is amenable to manufacture by micro-machining techniques.

FIG. 1 is a view of an embodiment of a latching relay of the present invention. Referring to FIG. 1, the relay 100 comprises three layers: a circuit layer 102, a switching layer 104 and a cap layer 106. The circuit layer 102 supports electrical connections to the elements in the switching layer and provides a lower cap to the switching layer. The circuit layer 102 also supports a ground trace 118 that forms parts of a ground conductor encircling the switching elements. The circuit layer 102 may be made of a ceramic or silicon, for example, and is amenable to manufacture by micro-machining techniques, such as those used in the manufacture of micro-electronic devices. The switching layer 104 may be made of ceramic or glass, for example, or may be made of metal coated with an insulating layer (such as a ceramic). A channel passes through the switching layer. At one end of the channel in the switching layer is a signal conductor 134 that is electrically coupled to one of the switch contacts of the relay. Further ground conductors 130, 132 and 120 are electrically coupled to form a ground conductor or shield that is coaxial with the signal conductor 134. The signal conductor 134 is electrically isolated from the ground trace by a dielectric layer 122 that surrounds the signal conductor. In an exemplary embodiment, the ground conductor 120 is preferably formed as a trace deposited on the under side of the cap layer 106, while conductors 130 and 132 are fixed to the substrate of the switching layer. The cap layer 106 covers and seals the top of the switching layer 104. The cap layer 106 may be made of ceramic, glass, metal or polymer, for example, or combinations of these materials. Glass, ceramic or metal is preferably used in an exemplary embodiment to provide a hermetic seal.

Figure 2:
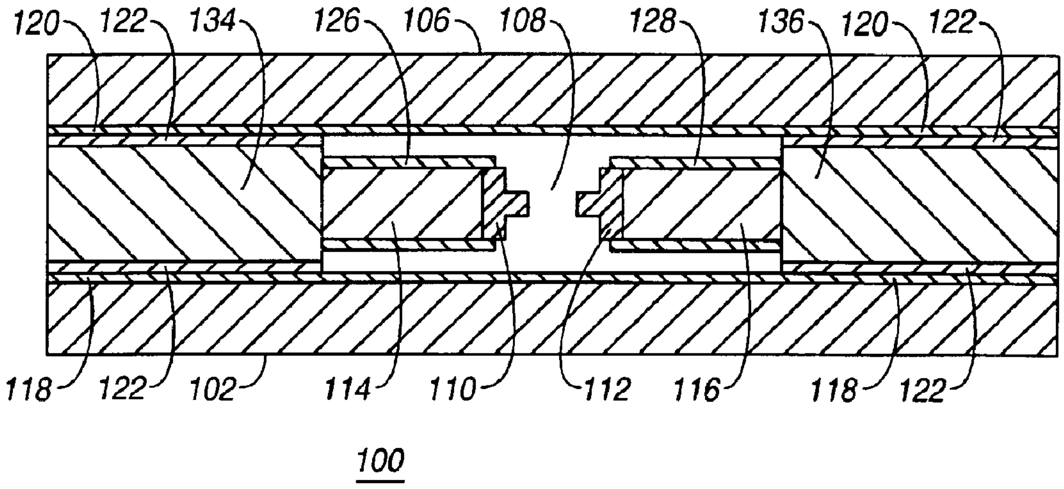
FIG. 2 is a sectional view of a latching relay in accordance with certain embodiments of the present invention.

FIG. 2 is a sectional view of an embodiment of a latching relay 100 of the present invention. The section is denoted by 2—2 in FIG. 1. Referring to FIG. 2, the switching layer incorporates a switching cavity 108. The cavity may be filled with an inert gas. First and second electrical contacts, 110 and 112, are situated within the cavity 108. A first actuator 114 is attached to the signal conductor 134 at one end and supports the first electrical contact 110 at the other end. In operation, the length of the actuator 114 is increased or decreased to move the first electrical contact 110 towards or away from the second electrical contact 112. In an exemplary embodiment, the actuator is preferably a piezoelectric actuator. The second electrical contact 112 is positioned facing the first electrical contact 110. The second electrical contact 112 may be attached directly to the signal conductor 136 or, as shown in the figure, it may be attached to a second actuator 116 that operates in opposition to the first actuator. The facing surfaces of the first and second electrical contacts are wettable by a conducting liquid. In operation, these surfaces support droplets of conducting liquid, held in place by the surface tension of the fluid. Due to the small size of the droplets, the surface tension dominates any body forces on the droplets and so the droplets are held in place. In an exemplary embodiment, the electrical contacts 110 and 112 preferably have a stepped surface. This increases the surface area and provides a reservoir for the conducting liquid. The actuators 114 and 116 are coated with non-wetting, conducting coatings 126 and 128, respectively. The coatings 126 and 128 electrically couple the contacts 110 and 112 to the signal conductors 134 and 136, respectively, and prevent migration of the conducting liquid along the actuators. Signal conductor 136 is electrically insulated from the ground traces by dielectric layer 122.

Figure 3:
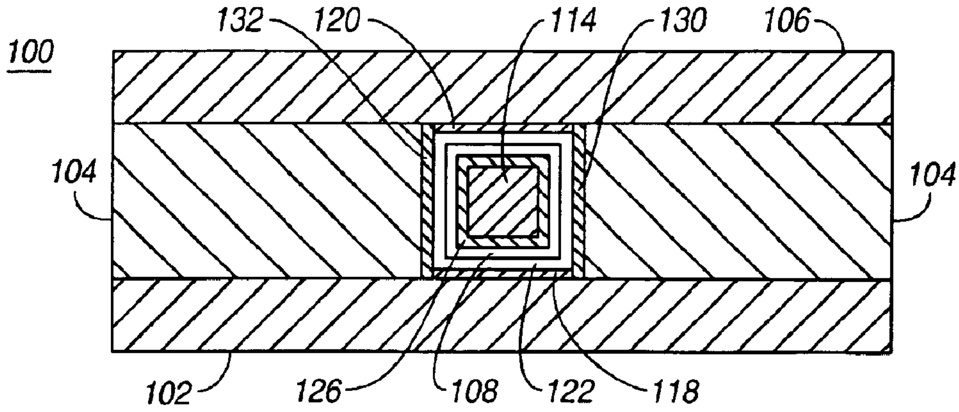
FIG. 3 is a further sectional view of a latching relay in accordance with certain embodiments of the present invention.
Figure 4:
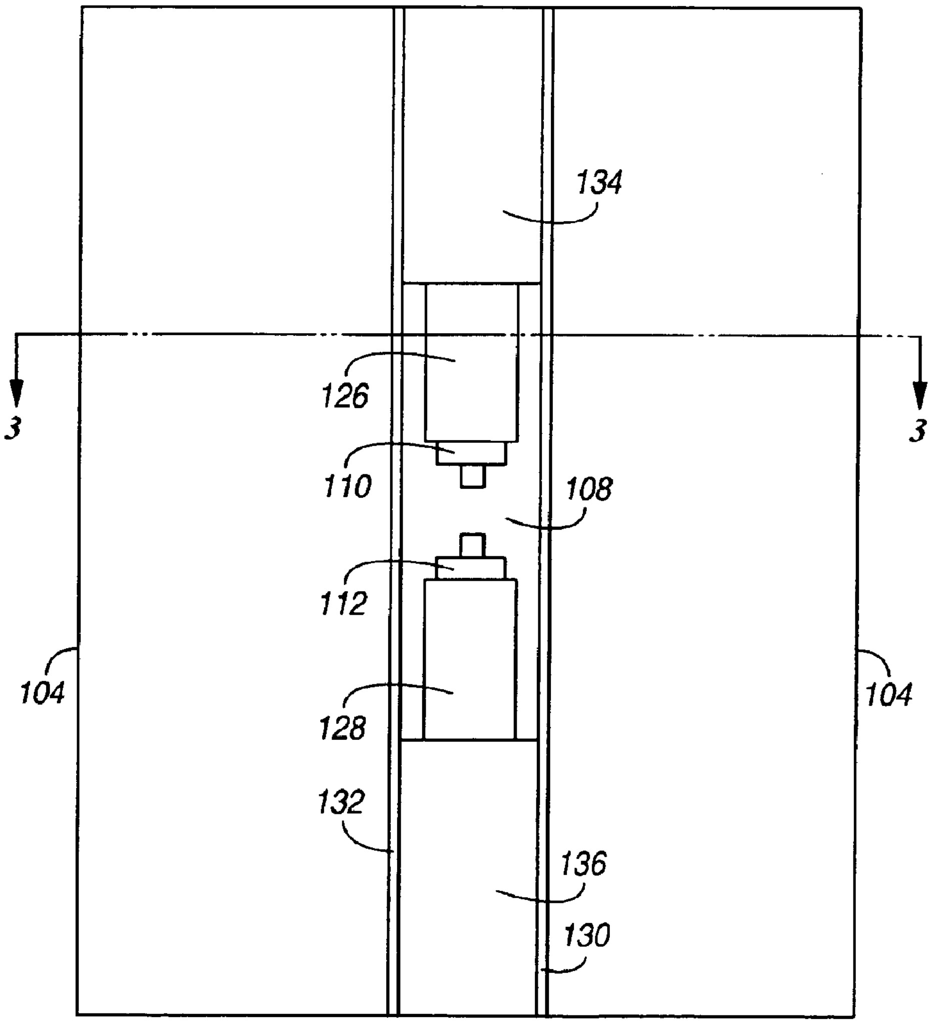
FIG. 4 is a view of a switching layer of a latching relay in accordance with certain embodiments of the present invention.

FIG. 3 is a sectional view through section 3—3 of the latching relay shown in FIG. 4. The view shows the three layers: the circuit layer 102, the switching layer 104 and the cap layer 106. Referring to FIG. 3, the first actuator 114 is positioned within the switching cavity 108. The switching cavity 108 is sealed below by the circuit layer 102 and sealed above by the cap layer 106. The ground conductors 120, 122, 130 and 132 surround the actuator 114 and its non-wetting, conducting coating 126. This facilitates high frequency switching of the relay.

FIG. 4 is a view of the relay from above (relative to FIGS. 1, 2 and 3) with the cap layer removed, that is, the section 4—4 in FIG. 1. The switching layer 104 incorporates the switching cavity 108, formed in the channel between the two signal conductors 134 and 136. Within the switching cavity 108 are the first and second electrical contacts, 110 and 112, and the actuators to which they are attached. The first actuator, with coating 126, is attached to the first signal conductor 134 at one end and supports the first electrical contact 110 at the other end. The second electrical contact 112 is positioned facing the first electrical contact 110. The second electrical contact 112 may be attached directly to the second signal conductor 136 or, as shown in the figure, it may be attached to the second actuator, with coating 128, that operates in opposition to the first actuator. Ground conductors 130 and 132 line the channel in the switching layer.

Figure 5:
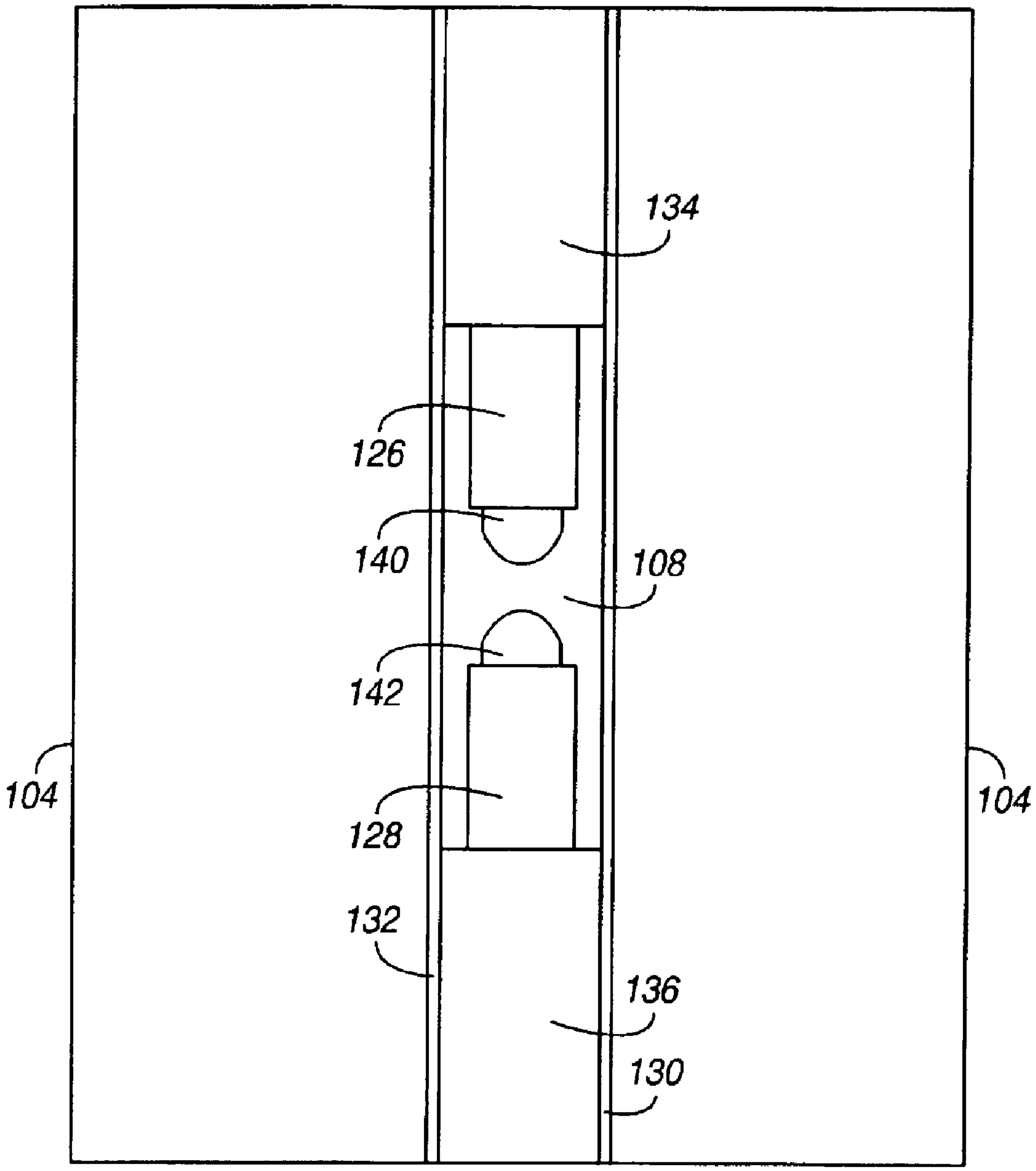
FIG. 5 is a view of a switching layer of a latching relay in an open switch state in accordance with certain embodiments of the present invention.

In operation, the electrical contacts 110 and 112 support droplets of a conducting liquid, such as liquid mercury. FIG. 5 is a further view of the relay from above with the top layer removed. Referring to FIG. 5, the conducting liquid droplets 140 and 142 cover the electrical contacts. The volume of the conducting liquid and the spacing between the contacts is such that there is insufficient liquid to bridge the gap between the contacts. When the liquid droplets are separated, as in FIG. 5, the electrical circuit between the contacts is open.

Figure 6:
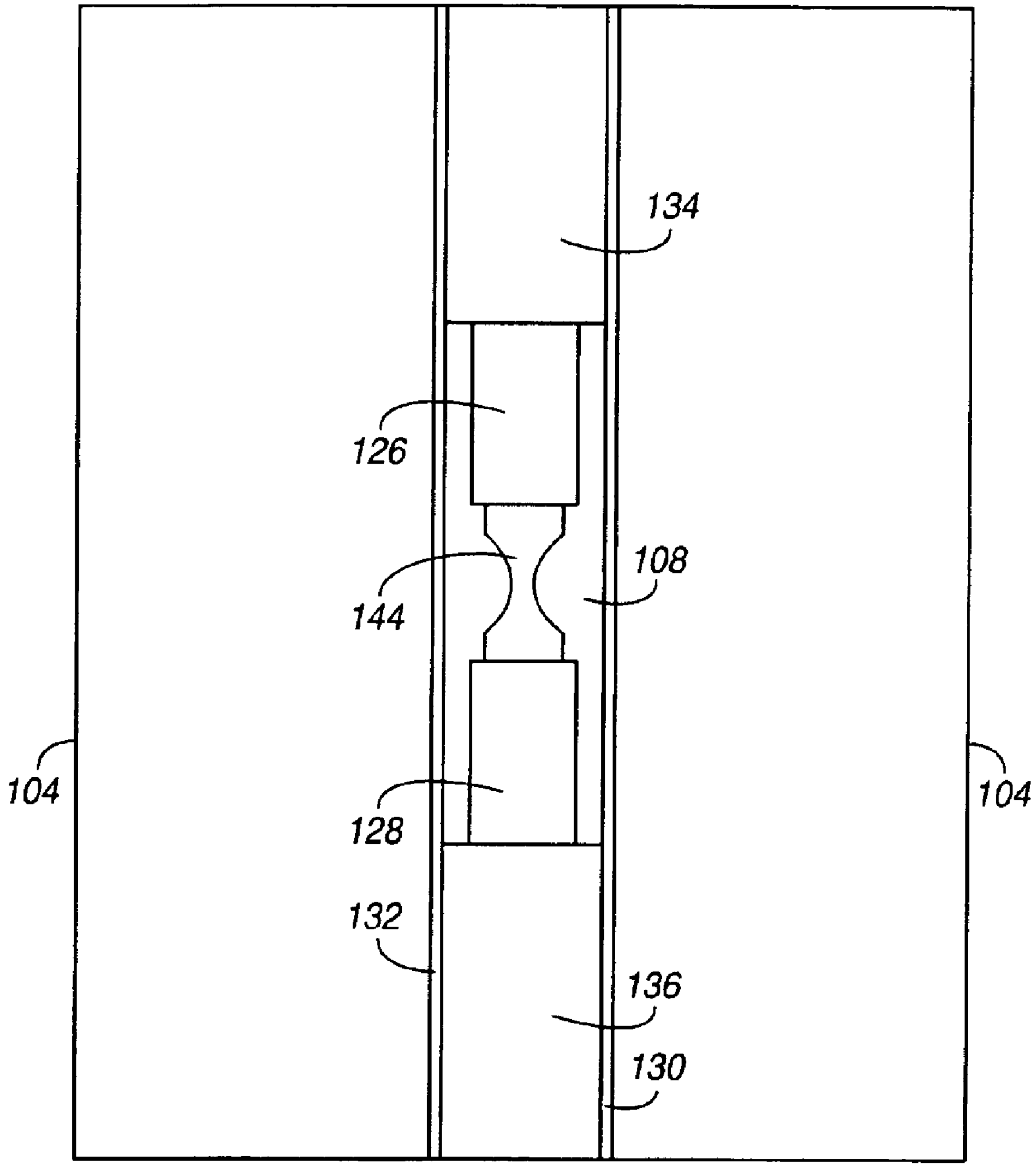
FIG. 6 is a view of a switching layer of a latching relay in a closed switch state in accordance with certain embodiments of the present invention.

To complete the electrical circuit between the contacts, the contacts are moved together so that the two liquid droplets coalesce. This may be achieved by energizing one or both of the actuators. When the droplets have coalesced, the electrical circuit is completed. When the actuators are de-energized, the contacts return to their original positions. However, the volume of conducting liquid and the spacing of the contacts is such that the liquid droplets remain coalesced due to surface tension in liquid. This is shown in FIG. 6. Referring to FIG. 6, the two droplets remain coalesced as the single liquid volume 144. In this manner the relay is latched and the electrical circuit remains completed when the relay actuators are de-energized. When the electrical circuit is closed, the signal path is from the first signal conductor, through the first conductive coating, the first contact, the conducting liquid, the second contact and the second conductive coating, and finally through the second signal conductor. The ground conductor provides a shield surrounding the signal path. The use of mercury or other liquid metal with high surface tension to form a flexible, non-contacting electrical connection results in a relay with high current capacity that avoids pitting and oxide buildup caused by local heating. To break the electrical circuit again, the distance between the two electrical contacts is increased until the surface tension bond between the two liquid droplets is broken.

Figure 7:
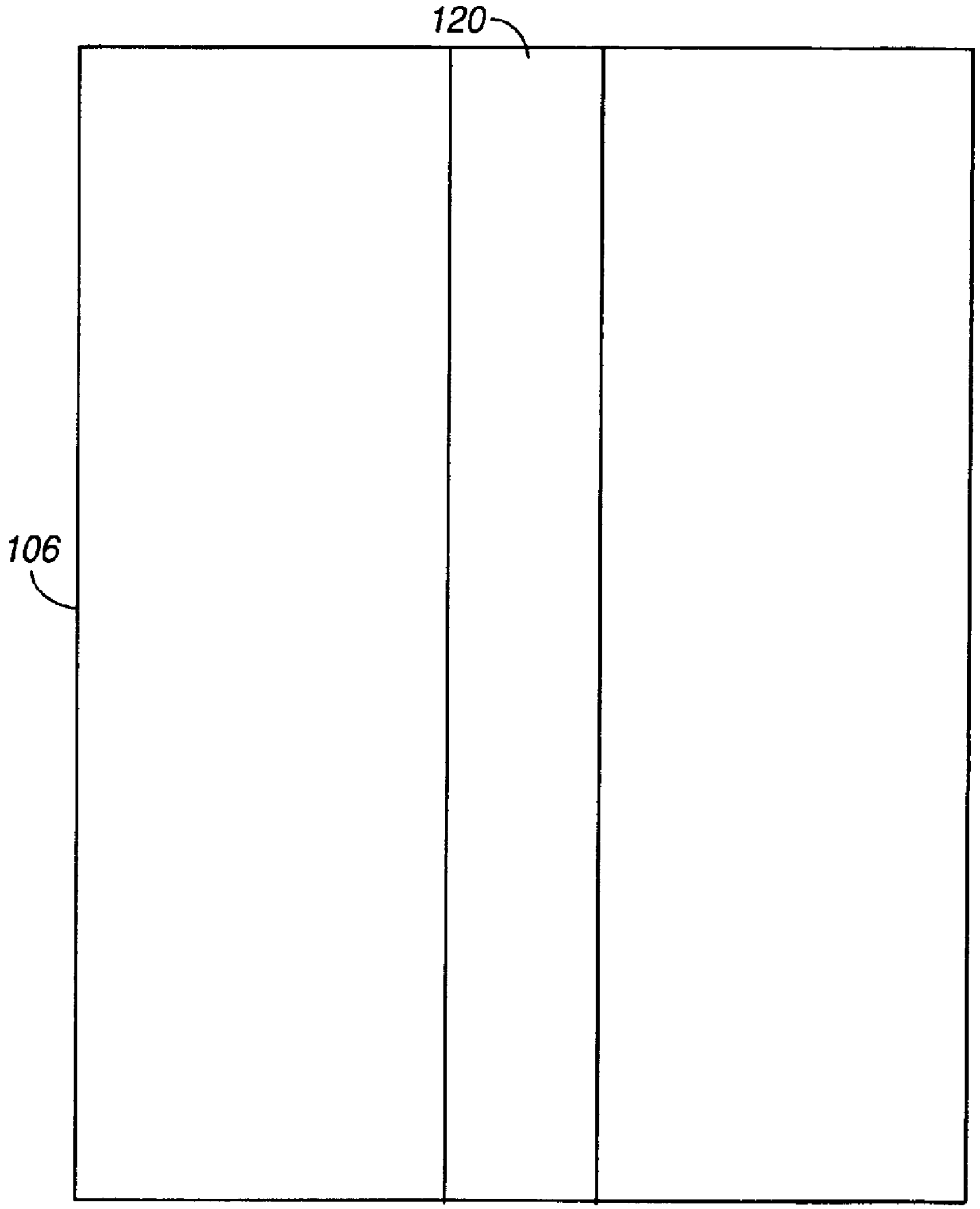
FIG. 7 is a view of a cap layer of a latching relay in accordance with certain embodiments of the present invention.

FIG. 7 is a view of the inside surface of the cap layer 106. The cap layer 106 provides a seal for the channel in the switching layer. A ground trace 120 is deposited on the surface of the cap layer, and forms one side of the ground conductor that is coaxial with the signal conductors and switching mechanism. A similar ground trace is deposited on the inner surface of the circuit layer.

While the invention has been described in conjunction with specific embodiments, it is evident that many alternatives, modifications, permutations and variations will become apparent to those of ordinary skill in the art in light of the foregoing description. Accordingly, the present invention is intended to embrace all such alternatives, modifications and variations as fall within the scope of the appended claims.

What is claimed is:

1. An electrical relay, comprising:

a first electrical contact, having a wettable surface;

a first signal conductor, electrically coupled to the first electrical contact;

a first conducting liquid droplet in wetted contact with the first electrical contact;

a second electrical contact, spaced from and aligned with the first electrical contact and having a wettable surface facing the wettable surface of the first electrical contact;

a second signal conductor, electrically coupled to the second electrical contact;

a second conducting liquid droplet in wetted contact with the second electrical contact;

a ground shield, encircling the first and second electrical contacts and the first and second signal conductors; and a first actuator in a rest position, coupled to the first electrical contact and operable to move the first electrical contact towards the second electrical contact, to cause the first and second conducting liquid droplets to coalesce and complete an electrical circuit between the first and second electrical contacts, and away from the second electrical contact, to cause the first and second conducting liquid droplets to separate and break the electrical circuit.

2. An electrical relay in accordance with claim 1, wherein the first actuator is one of a piezoelectric actuator and a magnetorestrictive actuator.

3. An electrical relay in accordance with claim 1, wherein the first and second conducting liquid droplets are liquid metal droplets.

4. An electrical relay in accordance with claim 1, further comprising a second actuator, coupled to the second electrical contact and operable to move the second electrical contact towards the first electrical contact, to cause the first and second conducting liquid droplets to coalesce and complete an electrical circuit, and away from the first electrical contact, to cause the first and second conducting liquid droplets to separate and break the electrical circuit.

5. An electrical relay in accordance with claim 4, wherein the second actuator is one of a piezoelectric actuator and a magnetorestrictive actuator.

6. An electrical relay in accordance with claim 1, wherein the volumes of the first and second conducting liquid droplets are such that coalesced droplets remain coalesced when the actuator is returned to its rest position, and separated droplets remain separated when the actuator is returned to its rest position.

7. An electrical relay in accordance with claim 1, wherein the wettable surfaces of the first and second electrical contacts are stepped.

8. An electrical relay in accordance with claim 1, wherein the first electrical contact is electrically coupled to the first signal conductors by a non-wettable, conductive coating on the first actuator.

9. An electrical relay in accordance with claim 1, further comprising a dielectric layer positioned between the ground shield and the first and second signal conductors, the dielectric layer electrically insulating the ground shield from the first and second signal conductors.

10. An electrical relay in accordance with claim 1, further comprising:

a circuit substrate supporting electrical connections to the first actuator;

a cap layer; and a switching layer positioned between the circuit substrate and the cap layer and having a channel formed therein;

wherein the ground shield lines the channel and the first actuator, the first and second electrical contacts and the first and second signal conductors are positioned within the channel.

11. An electrical relay in accordance with claim 10, wherein at least one of the electrical connections to the first actuator passes through the circuit substrate and terminates in a solder ball.

12. An electrical relay in accordance with claim 10, wherein the electrical connections to the first actuator comprise traces deposited on the surface of the circuit substrate.

13. An electrical relay in accordance with claim 10, wherein at least one of the electrical connections to the first actuator is deposited on the surface of the circuit substrate and terminates in a wirebond.

14. An electrical relay in accordance with claim 10, manufactured by a method of micro-machining.

15. An electrical relay in accordance with claim 14, wherein a first part of the ground shield is deposited on the inner surface of the cap layer and a second part of the ground shield is deposited on the inner surface of the circuit layer.

16. An electrical relay, comprising:

a ground shield comprising an electrically conducting hollow tube having a first end and a second end;

a first dielectric layer lining the first end of the hollow tube;

a first signal conductor located in the first end of the hollow tube and electrically isolated from the hollow tube by the first dielectric layer;

a first electrical contact, electrically coupled to the first signal conductor;

a second dielectric layer lining the second end of the hollow tube;

a second signal conductor located in the second end of the hollow tube and electrically isolated from the hollow tube by the second dielectric layer;

a second electrical contact, electrically coupled to the second signal conductor;

a first conducting liquid volume in wetted contact with the first electrical contact; and a second conducting liquid volume in wetted contact with the second electrical contact;

a first actuator within the hollow tube coupled to the first signal conductor at one end and supporting the first electrical contact at the other end and operable to move the first electrical contact towards the second electrical contact, thereby causing the first and second conducting liquid droplets to coalesce and complete an electrical circuit between the first and second electrical contacts; and a second actuator within the hollow tube coupled to the second signal conductor at one end and supporting the second electrical contact at the other end and operable to move the second electrical contact away from the first electrical contact, thereby causing the first and second conducting liquid droplets to separate and break the electrical circuit.

17. An electrical relay in accordance with claim 16, wherein one of the first and second actuators is a piezoelectric actuator.

18. An electrical relay in accordance with claim 16, wherein one of the first and second actuators is a magnetorestrictive actuator.

19. An electrical relay in accordance with claim 16, wherein the first and second conducting liquid droplets are liquid metal droplets.

20. An electrical relay in accordance with claim 16, wherein the ground shield is contained within a rigid housing.

21. An electrical relay in accordance with claim 16, wherein the first electrical contact is electrically coupled to the first signal conductors by a non-wettable, conductive coating on the first actuator and the second electrical contact is electrically coupled to the second signal conductors by a non-wettable, conductive coating on the second actuator.

22. An electrical relay in accordance with claim 16, wherein the first actuator is operable to move the first electrical contact away from the second electrical contact and the second actuator is operable to move the second electrical contact away from the first electrical contact.

* * * * *